(12) United States Patent
Lai

(10) Patent No.: US 7,008,733 B2
(45) Date of Patent: Mar. 7, 2006

(54) METHOD OF IMPROVING A RESOLUTION OF CONTACT HOLE PATTERNS BY UTILIZING ALTERNATE PHASE SHIFT PRINCIPLE

(75) Inventor: Jun-Cheng Lai, Hsin-Chu (TW)

(73) Assignee: Powerchip Semiconductor Corp., Hsin-Chu (TW)

(*) Notice: Subject to any disclaimer, the term of this patent is extended or adjusted under 35 U.S.C. 154(b) by 250 days.

(21) Appl. No.: 10/605,377

(22) Filed: Sep. 25, 2003

(65) Prior Publication Data

US 2005/0069781 A1    Mar. 31, 2005

(51) Int. Cl.
*G01F 9/00*    (2006.01)

(52) U.S. Cl. ............................................ 430/5
(58) Field of Classification Search ............... None
See application file for complete search history.

(56) References Cited

U.S. PATENT DOCUMENTS 6,077,633 A * 6/2000 Lin et al. .................... 430/5
6,183,916 B1   2/2001 Kuo et al.
6,274,281 B1 * 8/2001 Chen ........................... 430/5
6,759,328 B1 * 7/2004 Wu .......................... 438/652

FOREIGN PATENT DOCUMENTS

TW        423048        2/2001

* cited by examiner

*Primary Examiner*—S. Rosasco
(74) *Attorney, Agent, or Firm*—Winston Hsu

(57) ABSTRACT

A method of forming a plurality of isolated and closed patterns arranged in an array in a photoresist layer. A phase shift mask is provided. A plurality of first phase shift transparent regions, a plurality of second phase shift transparent regions, and a non-phase shift region are included on the phase shift mask. The first phase shift transparent regions and the second phase shift transparent regions are regularly interlaced in an array. Each of the first phase shift transparent regions and each of the second phase shift transparent regions are separated by the non-phase shift region. An exposure process is perform to form the closed patterns corresponding to the first phase shift transparent regions and the second phase shift transparent regions in the photoresist layer.

16 Claims, 5 Drawing Sheets

METHOD OF IMPROVING A RESOLUTION OF CONTACT HOLE PATTERNS BY UTILIZING ALTERNATE PHASE SHIFT PRINCIPLE

BACKGROUND OF INVENTION

1. Field of the Invention

The present invention relates to a lithography method, and more particularly, to a lithography method utilizing an alternate phase shift mask (alt PSM) to eliminate a side-lobe effect and to form patterns having a superior resolution in a photoresist layer.

2. Description of the Prior Art

In integrated circuit making processes, a lithographic process has become a mandatory technique. In a lithographic process, a designed pattern, such as a circuit pattern, a doping pattern, or a contact hole pattern is created on one or several photo masks, then the pattern on the photo mask is transferred by light exposure, with a stepper and scanner, into a photoresist layer on a semiconductor wafer. Only by using a lithographic process can a wafer producer precisely and clearly transfer a complicated circuit pattern onto a semiconductor wafer.

It is an important issue for solving resolution of the lithographic process due to the reducing device sizes of the semiconductor industry. Theoretically, using short wavelengths of light to expose a photoresist layer will improve the resolution right away. Short wavelengths of light are desirable as the shorter the wavelength, the higher the possible resolution of the pattern. This method, though it seems simple, is not feasible. First, light sources for providing short wavelengths of light are not accessible. Secondly, the damage of equipment is very considerable when short wavelengths of light is used to expose a photoresist layer, leading to a shorted equipment lifetime. The cost is thus raised, which makes products not competitive. Due to the conflicts between theory and practice used in manufacturing, the manufacturers are all devoted to various researches so as to get over this problem.

Please refer to FIG. 1. FIG. 1 is a schematic diagram illustrating a method for improving a resolution of contact hole patterns 22 by utilizing assist features according to the prior art. As shown in FIG. 1, the prior art method for improving the resolution of the contact hole patterns 22 by utilizing assist features is to proceed an optical proximity correction (OPC) of a photo mask pattern first. That means, some small assist bars (not shown) are inserted into a regular layout pattern according to results of simulation when outlaying a mask (not shown). Then, the mask layout (not shown) is transferred onto the photo mask 10 after a verify procedure is proceeded. Except for a plurality of contact hole features 12, a plurality of assist features 14 inserted between contact hole features 12 are included on the photo mask 10.

An exposure process is thereafter performed to irradiate the photo mask 10 with light so that a plurality of contact hole patterns 22, corresponding to the contact hole features 12, are formed in a photoresist layer 18 on a surface of the wafer 16. Since the assist features 14 inserted between the contact hole features 12 are merely used for improving the resolution of each of the contact hole patterns 22 by applying light interference principle, their corresponding patterns are not formed in the photoresist layer 18 after the exposure process. Therefore, the photoresist layer 18 is smooth, except for the contact hole patterns 22 to allow contact holes (not shown), to be formed in a subsequent etching process.

In addition to the prior art method for improving the resolution of the contact hole patterns by utilizing assist features, another method involves the use of a half-tone mask. The half-tone mask is a kind of phase shift mask. Please refer to FIG. 2. FIG. 2 is a schematic diagram illustrating a prior art method for improving a resolution of contact hole patterns 44 by utilizing a half-tone mask. As shown in FIG. 2, the half-tone mask 30 is formed from a quartz substrate. A plurality of contact hole features 32 and a not completely transparent region 34 enclosing each of the contact hole features 32 are included on the half-tone mask 30. Actually, the not completely transparent region 34 of the half-tome mask 30 is coated with a single-layered embedded layer 36. The embedded layer 36 is not only an absorption layer, but also is a phase shift layer. Since the transmittance and the phase shift angle required by the process can be achieved by utilizing the single-layered embedded layer 36, the embedded layer 36 is also called an absorptive shifter.

When a specific wavelength of light (correlating to the embedded layer) is utilized to perform the exposure process, light will pass through each of the contact hole features 32 successfully to reach a photoresist layer 42 on a wafer 38. Because the embedded layer 36 has a specific transmittance (usually between 2~15%), portions of the light passing through the embedded layer 36 will have a phase shift of 180 degrees relative to the original light, and resulting in destructive interference with the light passing through the contact hole features 32. After a develop and a bake process are performed, the contact hole patterns 44 corresponding to the contact hole features 32 will be formed in the photoresist layer 42. Thanks to the interference effect caused by light passing through the embedded layer 36, the resolution of the contact hole patterns 44 is improved.

However, both of the above-mentioned methods have limitation, in application or in effect. When the assist features are utilized to improve the resolution of the contact hole patterns, the resolution is not improved if the patterns to be formed are too small. Moreover, the contact hole patterns, that should be separated from each other, may connect together after the lithography process. In fact, a ratio of the spacing between the patterns to be formed to a line width of the patterns to be formed must be greater than ½ when using this method. When utilizing the half-tone mask to improve the resolution of the contact hole patterns, the light intensity of the side-lobe is too high to produce extra patterns if the transmittance of the embedded layer is too high. If the transmittance of the embedded layer is too low, the destructive interference of light caused by the phase shift is not enough. The side-lobe phenomenon at the edge of patterns cannot be eliminated, leading to the unsatisfied pattern edge resolution.

In addition, some methods involve adjusting equipment parameters, such as changing exposure energy, changing exposure time, adjusting aperture, and utilizing off-axis illumination method, have been adapted in order to achieve a better resolution and make a compromise between resolution and depth of focus. However, satisfied results are not obtained. At the same time, manpower and time are wasted and equipment is damaged. Therefore, it is very important to develop a lithography method to improve the resolution of the contact hole patterns effectively. This method is able to be applied to small-sized patterns, and should not damage equipment when using the current equipment.

SUMMARY OF INVENTION

It is therefore an objective of the claimed invention to provide a known alternate phase shift principle to improve a resolution and a depth of focus for contact hole patterns.

According to the claimed invention, a lithography method for forming a plurality of closed patterns in a photoresist layer on a substrate is provided. The patterns are isolated from each other and are arranged in an array. The lithography method includes to provide a phase shift mask first, and then to perform an exposure process to form the closed patterns in the photoresist layer. The phase shift mask includes a plurality of first phase shift transparent regions, a plurality of second phase shift transparent regions having a phase shift relative to the first phase shift transparent regions, and a non-phase shift region. The first phase shift transparent regions and the second phase shift transparent regions are regularly interlaced in an array, and each of the first phase shift transparent regions and each of the second phase shift transparent regions are separated by the non-phase shift region. The closed patterns formed in the exposure process are corresponding to the first phase shift transparent regions and the second phase shift transparent regions.

The present invention method for improving the resolution of the contact hole patterns utilizes an alternate phase shift mask and the conventional exposure, develop, and bake processes to form the contact hole patterns having a superior resolution in the photoresist layer through a single time exposure. Therefore, the tiny assist bars do not need to be inserted into the mask layout. The application range is enlarged because the ratio of the spacing between the patterns to the line width of the patterns does not need to be greater than ½. In addition, when utilizing the designed alternate phase shift mask to form the contact hole patterns, the side-lobe phenomenon is eliminated due to the destructive interference of light at the edge of the contact hole patterns. The resolution of the contact hole patterns, which can not be improved by utilizing the half-tone mask, is thus improved. Since the present invention method is able to form the contact hole patterns having a superior resolution with facility, light source generating short wavelength of light does not need to be used when performing the exposure process. Furthermore, exposure energy, exposure time, aperture, and off-axis illumination method do not need to be adjusted. As a result, manpower is saved, equipment lifetime is elongated, cycle time is shorted, and the cost is reduced.

These and other objectives of the claimed invention will no doubt become obvious to those of ordinary skill in the art after reading the following detailed description of the preferred embodiment, which is illustrated in the multiple figures and drawings.

DETAILED DESCRIPTION

Figure 1:
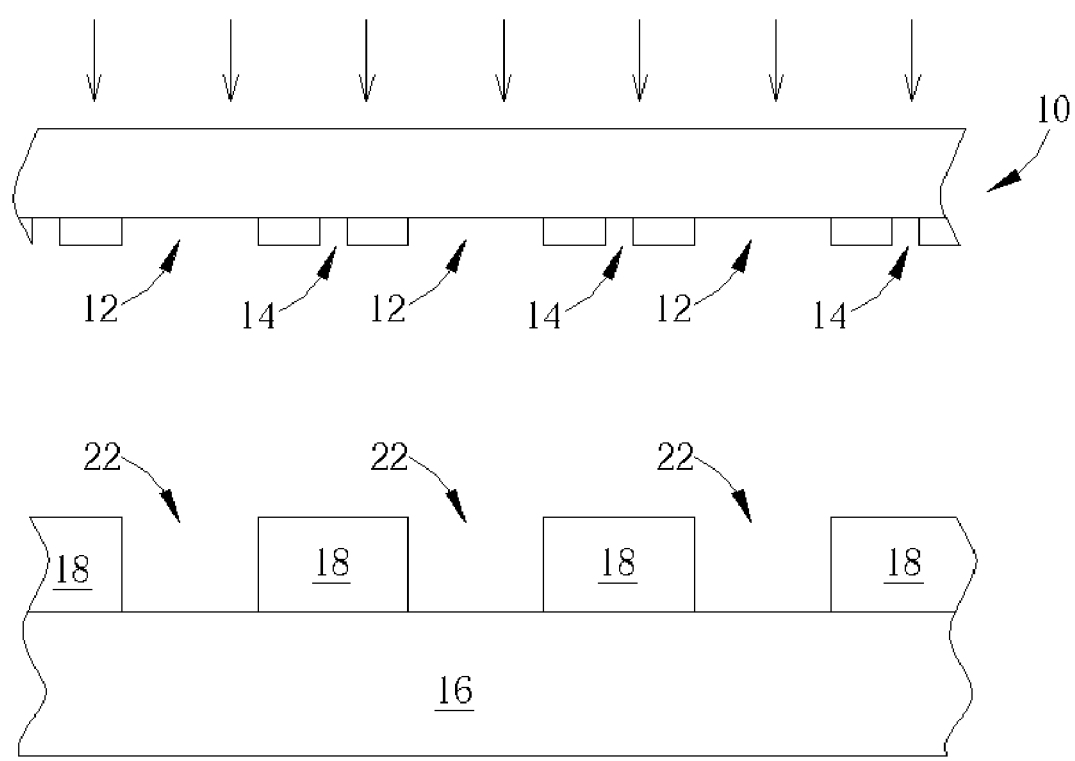
FIG. 1 is a schematic diagram illustrating a method for improving a resolution of contact hole patterns by utilizing assist features according to the prior art.
Figure 2:
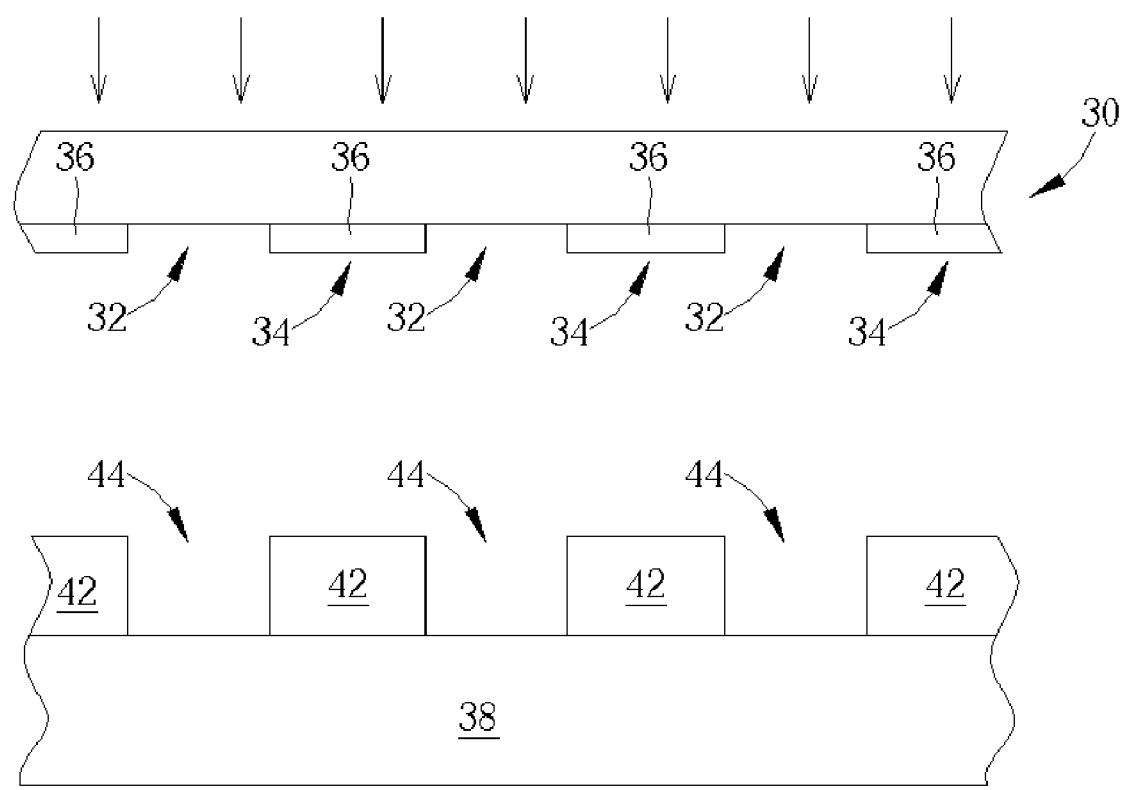
FIG. 2 is a schematic diagram illustrating a prior art method for improving a resolution of contact hole patterns by utilizing a half-tone mask.
Figure 3:
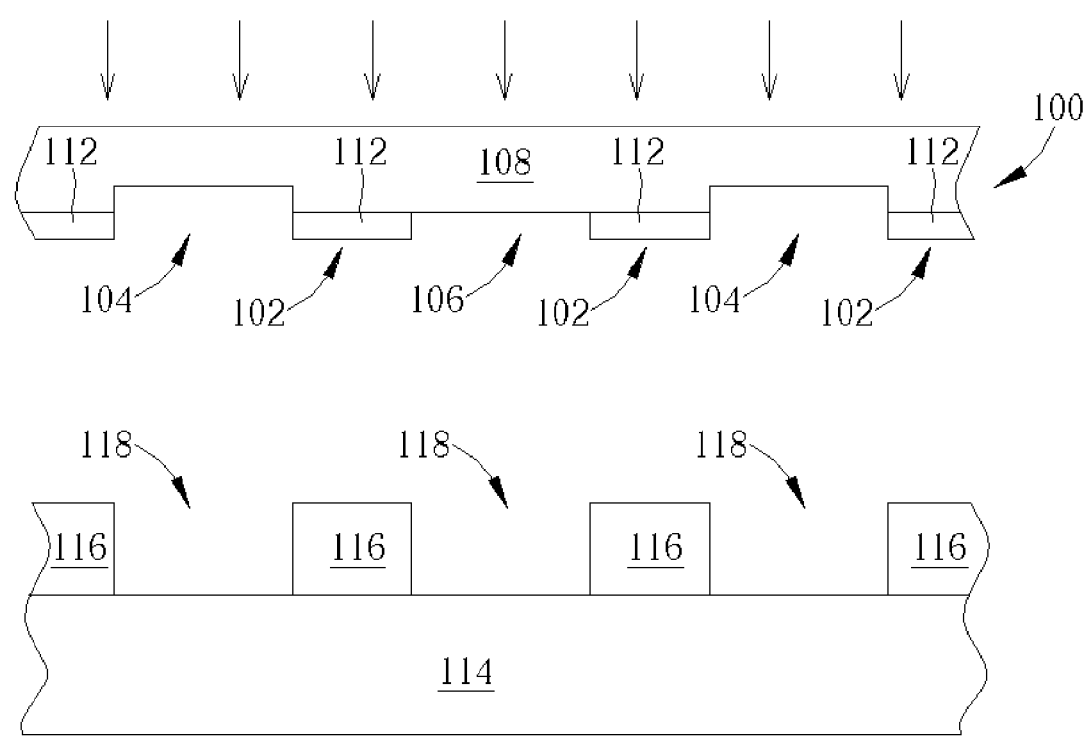
FIG. 3 is a schematic diagram illustrating a method for improving a resolution of closed patterns, such as contact hole patterns, in a photoresist layer by utilizing an alternate phase shift mask according to a first preferred embodiment of the present invention.
Figure 4:
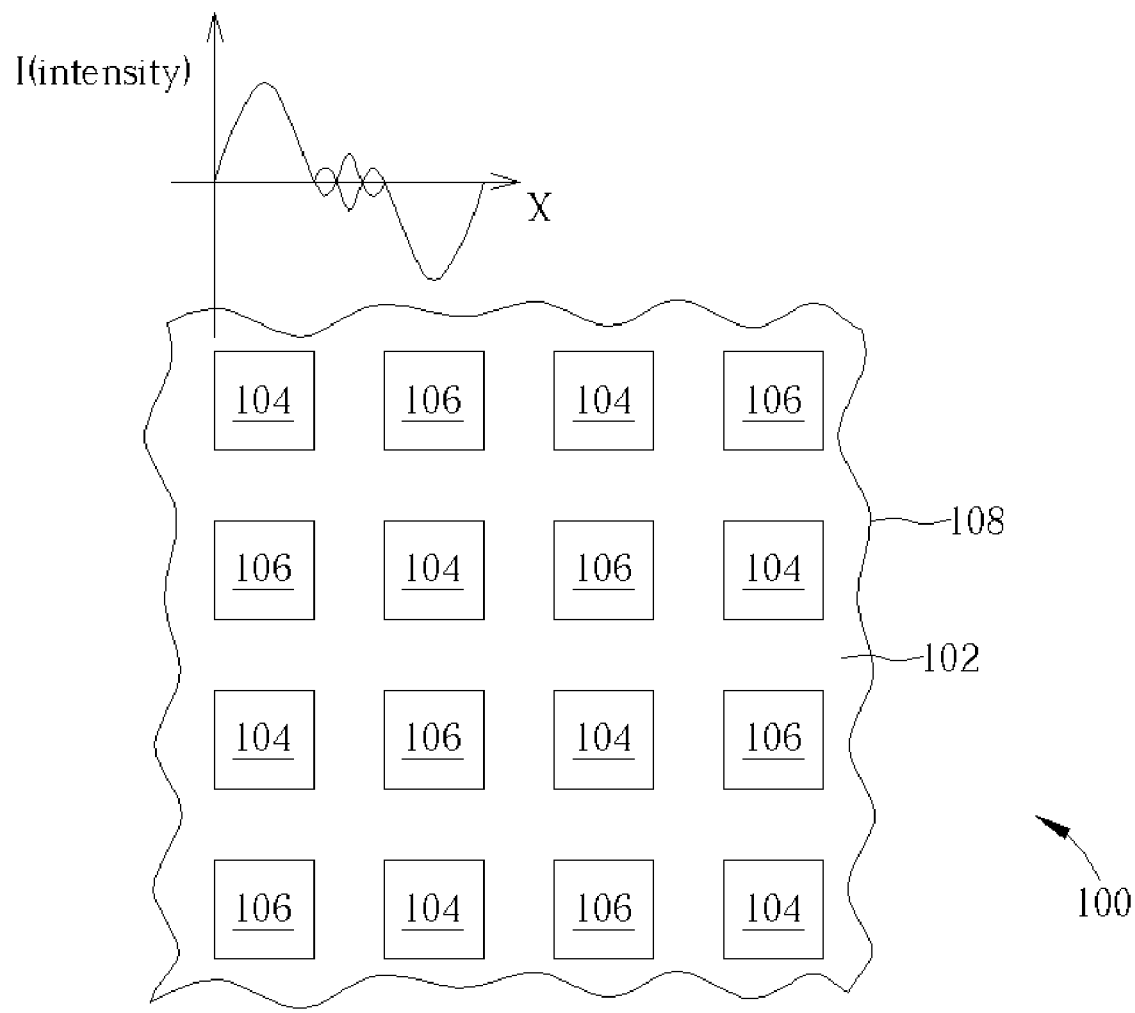
FIG. 4 is a top view of the alternate phase shift mask according to the first preferred embodiment of the present invention.

Please refer to FIG. 3 and FIG. 4. FIG. 3 is a schematic diagram illustrating a method for improving a resolution of closed patterns, such as contact hole patterns 118, in a photoresist layer by utilizing an alternate phase shift mask according to a first preferred embodiment of the present invention. FIG. 4 is a top view of the alternate phase shift mask 100 according to the first preferred embodiment of the present invention. As shown in FIG. 3 and FIG. 4, the present invention method to improve the resolution of the contact hole patterns is to provide an alternate phase shift mask 100 first. The alternate phase shift mask 100 is a kind of phase shift mask. An opaque region 102 formed from a chrome film, a plurality of first phase shift transparent regions 104, and a plurality of second phase shift transparent regions 106 are included on the alternate phase shift mask 100. The first phase shift transparent regions 104 and the second phase shift transparent regions 106 are regularly interlaced in an array, and each of the first phase shift transparent regions 104 and each of the second phase shift transparent regions 106 are separated by the opaque region 102.

The first phase shift transparent region 104 and the second phase shift transparent region 106 are both formed from quartz. The first phase shift transparent region 104 has a phase shift of 180 degrees relative to the second phase shift transparent region 106. That means, when the phase of the first phase shift transparent region 104 is 0, the phase of the second phase shift transparent region 106 is $\pi$; when the phase of the first phase shift transparent region 104 is $\pi$, the phase of the second phase shift transparent region 106 is 0. The term "alternate phase shift mask" thus originates from this fact. Actually, the first phase shift transparent regions 104 and the second phase shift transparent regions 106 are formed on a same quartz substrate 108. By etching the quartz substrate 108 into two different thicknesses, the first phase shift transparent regions 104 and the second phase shift transparent regions 106 are defined. Moreover, other portions of the quartz substrate 108 are plated with a chrome film 112 and used as the opaque region 102.

The present invention method for improving the resolution of the contact hole patterns by utilizing an alternate phase shift mask uses the same exposure process and development process as the prior art method. However, when light passes through the alternate phase shift mask 100 during the exposure process, an optical path difference is resulted in due to the thickness difference between the first phase shift transparent regions 104 and the second phase shift transparent regions 106. Therefore, light passing through the first phase shift transparent regions 104 has a phase shift of 180 degrees relative to light passing through the second phase shift transparent regions 106 to result in a destructive interference.

As shown in FIG. 4, although light passing through the first phase shift transparent regions 104 and the second phase shift transparent regions 106 produces the diffractive waveform of the first order, the second order, etc., light passing through the first phase shift transparent regions 104 will always have a phase shift of 180 degrees relative to light passing through the second phase shift transparent regions 106. After the exposure, develop, and bake processes, a plurality of contact hole patterns 118 corresponding to the first phase shift transparent regions 104 and the second phase shift transparent regions 106 are formed in a positive photoresist layer 116 on a wafer 114. Because of the destructive interference of light occurring in the opaque region 102, the side-lobe phenomenon at the edge of the contact hole patterns 118 is eliminated. Consequently, the contact hole pattern 118 has a superior resolution.

It should be noted that the alternate phase shift mask 100 is used to improve the resolution of the contact hole patterns 118 in the first preferred embodiment of the present invention. Actually, the present invention method may be applied to array structures having high pattern density, such as logic cells in a logic circuit. In addition, the present invention method is not only applied to a semiconductor wafer to produce semiconductor products, but is also applied to glass substrates, polymer substrates, or quartz substrates to produce other types of products. Furthermore, the opaque region 102 in the alternate phase shift mask 100 in this preferred embodiment may be designed as a not completely transparent region, and the transmittance of the not completely transparent region may be decided according to practical requirements, for example: 6%, 9%, 18%, or 20%. In the first preferred embodiment of the present invention, the first phase shift transparent regions 104 and the second phase shift transparent regions 106 are arranged in the manner disclosed in FIG. 4. In fact, any combinations that the first phase shift transparent regions and the second phase shift transparent regions are regularly interlaced in an array are included in the present invention.

Figure 5:
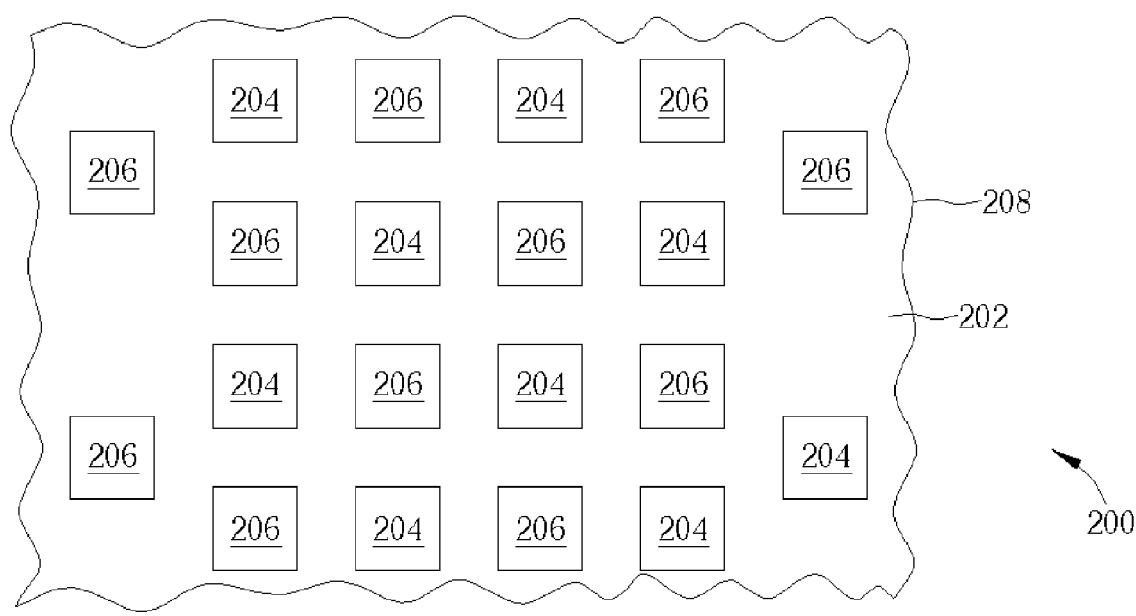
FIG. 5 is a top view of an alternate phase shift mask according to a second preferred embodiment of the present invention.

The present invention method utilizing an alternate phase shift mask to improve the resolution of the contact hole patterns is not limited to the preferred embodiment disclosed in FIG. 3 and FIG. 4. Please refer to FIG. 5. FIG. 5 is a top view of an alternate phase shift mask 200 according to a second preferred embodiment of the present invention. As shown in FIG. 5, an opaque region 202 formed from a chrome film, a plurality of first phase shift transparent regions 204, and a plurality of second phase shift transparent regions 206 are included on the alternate phase shift mask 200. Each of the first phase shift transparent regions 204 and each of the second phase shift transparent regions 206 are surrounded by the opaque region 202. Portions of the first phase shift transparent regions 204 and portions of the second phase shift transparent regions 206 are regularly interlaced in an array, and portions of the first phase shift transparent regions 204 and portions of the second phase shift transparent regions 206 are not arranged regularly and interlaced (the transparent regions at both sides in FIG. 5).

The first phase shift transparent region 204 and the second phase shift transparent region 206 are both formed from quartz. The first phase shift transparent region 204 has a phase shift of 180 degrees relative to the second phase shift transparent region 206. That means, when the phase of the first phase shift transparent region 204 is 0, the phase of the second phase shift transparent region 206 is π; when the phase of the first phase shift transparent region 204 is π, the phase of the second phase shift transparent region 206 is 0. Actually, the first phase shift transparent regions 204 and the second phase shift transparent regions 206 are formed on a same quartz substrate 208. By etching the quartz substrate 208 into two different thicknesses, the first phase shift transparent regions 204 and the second phase shift transparent regions 206 are defined. Moreover, other portions of the quartz substrate 208 are plated with the chrome film (not shown) and used as the opaque region 202.

When light passes through the alternate phase shift mask 200 during the exposure process, an optical path difference is resulted in due to the thickness difference between the first phase shift transparent regions 204 and the second phase shift transparent regions 206. Therefore, light passing through the first phase shift transparent region 204 has a phase shift of 180 degrees relative to light passing through the second phase shift transparent region 206 to result in a destructive interference. After the exposure, develop, and bake processes, a plurality of contact hole patterns (not shown) corresponding to the first phase shift transparent regions 204 and the second phase shift transparent regions 206 are formed in a positive photoresist layer (not shown) on a wafer (not shown). Although not all of the first phase shift transparent regions 204 and all of the second phase shift transparent regions 206 are regularly interlaced in an array, light passing through the alternate phase shift mask 200 will still proceed a destructive interference at the edge of the first phase shift transparent regions 204 and the second phase shift transparent regions 206, that are regularly interlaced in an array. As a result, the side-lobe phenomenon at the edge of the contact hole patterns (not shown) is eliminated to form contact hole patterns (not shown) having a superior resolution.

It should be noted that the method of the second preferred embodiment of the present invention can not only be used to improve the resolution of the contact hole patterns, but is also used to improve the resolution of array structures having high pattern density, such as logic cells in a logic circuit. In addition, the present invention method is not only applied to a semiconductor wafer to produce semiconductor products, but is also applied to glass substrates, polymer substrates, or quartz substrates to produce other types of products. Moreover, the opaque region 202 in the alternate phase shift mask 200 in this preferred embodiment may be designed as a not completely transparent region, and the transmittance of the not completely transparent region may be decided according to practical requirements, for example: 6%, 9%, 18%, or 20%.

The present invention lithography method, used for improving the resolution of the contact hole patterns, utilizes an alternate phase shift mask and utilizes the conventional exposure, develop, and bake processes to form the contact hole patterns, which have a superior resolution in the photoresist layer by a single time exposure. The side-lobe phenomenon is eliminated due to the destructive interference of light at the edge of the contact hole patterns, leading to the improved resolution of the contact hole patterns. In addition, the present invention lithography method can be applied to very tiny patterns. When the present invention method is applied to a practical production line, manpower is saved, equipment lifetime is elongated, cycle time is shorted, and the cost is reduced.

In contrast to the prior art method for improving the resolution of the contact hole patterns, the present invention method utilizes an alternate phase shift mask and the conventional exposure, develop, and bake processes to form the contact hole patterns having a superior resolution in the photoresist layer through a single time exposure. Therefore, the tiny assist bars do not need to be inserted into the mask layout. The application range is enlarged since the ratio of the spacing between the patterns to the line width of the patterns does not need to be greater than ½. Furthermore, when utilizing the designed alternate phase shift mask to form the contact hole patterns, the side-lobe phenomenon is eliminated due to the destructive interference of light at the edge of the contact hole patterns. The resolution of the contact hole patterns, which can not be improved by utilizing the half-tone mask, is thus improved. Because the present invention method is able to form the contact hole patterns which have a superior resolution with facility, light source generating short wavelength of light does not need to be used when performing the exposure process. Furthermore, exposure energy, exposure time, aperture, and off-axis illumination method do not need to be adjusted. Consequently, manpower is saved, equipment lifetime is elongated, cycle time is shorted, and the cost is reduced.

Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A lithography method for forming a plurality of closed patterns in a photoresist layer on a substrate, the patterns being isolated from each other and being arranged in an array, the lithography method comprising:
   providing a phase shift mask (PSM), wherein the phase shift mask comprises:
      a plurality of first phase shift transparent regions;
      a plurality of second phase shift transparent regions having a phase shift relative to the first phase shift transparent regions; and
      a non-phase shift region, wherein the first phase shift transparent regions and the second phase shift transparent regions are alternately disposed and each of the first phase shift transparent regions and each of the second phase shift transparent regions are separated by the non-phase shift region; and
   performing an exposure process to form the closed patterns in the photoresist layer,
wherein the closed patterns are corresponding to the first phase shift transparent regions and the second phase shift transparent regions.

2. The lithography method of claim 1 wherein the substrate is selected from the group consisting of a semiconductor wafer, a glass substrate, a polymer substrate, and a quartz substrate.

3. The lithography method of claim 1 wherein the photoresist layer is a positive photoresist layer.

4. The lithography method of claim 1 wherein the closed pattern is selected from the group consisting of a contact hole pattern and a logic cell pattern of a logic circuit.

5. The lithography method of claim 1 wherein the phase shift mask is an alternate phase shift mask (altPSM).

6. The lithography method of claim 5 wherein the first phase shift transparent regions have a phase shift of 180 degrees relative to the second phase shift transparent regions.

7. The lithography method of claim 1 wherein the non-phase shift region is an opaque region, and the non-phase shift region is formed from a chrome film.

8. The lithography method of claim 1 wherein the non-phase shift region is a not completely transparent region, and a transmittance of the non-phase shift region is selected from the group consisting of 6%, 9%, 18%, and 20%.

9. A lithography method for forming a plurality of closed patterns in a photoresist layer on a substrate, the patterns being isolated from each other and being arranged in an array, the lithography method comprising:
   providing a phase shift mask (PSM), wherein the phase shift mask comprises:
      a plurality of first phase shift transparent regions;
      a plurality of second phase shift transparent regions having a phase shift relative to the first phase shift transparent regions; and
      a non-phase shift region, wherein portions of the first phase shift transparent regions and portions of the second phase shift transparent regions are alternately disposed and each of the first phase shift transparent regions and each of the second phase shift transparent regions are separated by the non-phase shift region; and
   performing an exposure process to form the closed patterns in the photoresist layer,
   wherein the closed patterns are corresponding to the first phase shift transparent regions and the second phase shift transparent regions.

10. The lithography method of claim 9 wherein the substrate is selected from the group consisting of a semiconductor wafer, a glass substrate, a polymer substrate, and a quartz substrate.

11. The lithography method of claim 9 wherein the photoresist layer is a positive photoresist layer.

12. The lithography method of claim 9 wherein the closed pattern is selected from the group consisting of a contact hale pattern and a logic cell pattern of a logic circuit.

13. The lithography method of claim 9 wherein the phase shift mask is an alternate phase shift mask (altPSM).

14. The lithography method of claim 13 wherein the first phase shift transparent regions have a phase shift of 180 degrees relative to the second phase shift transparent regions.

15. The lithography method of claim 9 wherein the non-phase shift region is an opaque region, and the non-phase shift region is formed from a chrome film.

16. The lithography method of claim 9 wherein the non-phase shift region is a not completely transparent region, and a transmittance of the non-phase shift region is selected from the group consisting of 6%, 9%, 18%, and 20%.

* * * * *